(12) United States Patent
Siemieniec et al.

(10) Patent No.: US 9,478,655 B2
(45) Date of Patent: Oct. 25, 2016

(54) SEMICONDUCTOR DEVICE HAVING A LOWER DIODE REGION ARRANGED BELOW A TRENCH

(71) Applicant: Infineon Technologies AG, Neubiberg (DE)

(72) Inventors: Ralf Siemieniec, Villach (AT); Wolfgang Bergner, Klagenfurt (AT); Romain Esteve, Villach (AT); Dethard Peters, Hoechstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/718,443

(22) Filed: May 21, 2015

(65) Prior Publication Data

US 2015/0340487 A1    Nov. 26, 2015

(30) Foreign Application Priority Data

May 23, 2014    (DE) .......................... 10 2014 107 325

(51) Int. Cl.
*H01L 29/15*    (2006.01)
*H01L 31/0312*    (2006.01)
(Continued)

(52) U.S. Cl.
CPC .......... *H01L 29/7804* (2013.01); *H01L 21/046* (2013.01); *H01L 29/045* (2013.01); *H01L 29/167* (2013.01); *H01L 29/1608* (2013.01); *H01L 29/4236* (2013.01); *H01L 29/66068* (2013.01); *H01L 29/66734* (2013.01); *H01L 29/78* (2013.01); *H01L 29/0688* (2013.01); *H01L 29/861* (2013.01)

(58) Field of Classification Search
CPC ............. H01L 29/7804; H01L 21/046; H01L 29/4236; H01L 29/045; H01L 29/66068; H01L 29/78; H01L 29/167; H01L 29/66734; H01L 29/1608; H01L 29/0688; H01L 29/861
See application file for complete search history.

(56) References Cited

U.S. PATENT DOCUMENTS

2008/0164516 A1*   7/2008   Darwish ............. H01L 29/0649
                                                                     257/329
2009/0085103 A1*   4/2009   Hille ................... H01L 29/0619
                                                                     257/330
(Continued)

FOREIGN PATENT DOCUMENTS

JP       H9260650 A       10/1997
JP       2011035410 A      2/2011
(Continued)

*Primary Examiner* — Victor A Mandala
(74) *Attorney, Agent, or Firm* — Murphy, Bilak & Homiller, PLLC

(57) ABSTRACT

A semiconductor device includes a semiconductor body and at least one device cell integrated in the semiconductor body. Each device cell includes: a drift region, a source region, and a body region arranged between the source and drift regions; a diode region and a pn junction between the diode and drift regions; a trench having a first sidewall, a second sidewall opposite the first sidewall, and a bottom, the body region adjoining the first sidewall, the diode region adjoining the second sidewall, and the pn junction adjoining the bottom; a gate electrode in the trench and dielectrically insulated from the body, diode and drift regions by a gate dielectric. The diode region has a lower diode region arranged below the trench bottom, and the lower diode region has a maximum of a doping concentration distant to the trench bottom. A corresponding method of manufacturing the device also is provided.

30 Claims, 12 Drawing Sheets

(51) Int. Cl.
*H01L 29/78* (2006.01)
*H01L 29/16* (2006.01)
*H01L 29/66* (2006.01)
*H01L 29/167* (2006.01)
*H01L 21/04* (2006.01)
*H01L 29/423* (2006.01)
*H01L 29/04* (2006.01)
*H01L 29/861* (2006.01)
*H01L 29/06* (2006.01)

(56) References Cited

U.S. PATENT DOCUMENTS

2010/0193799 A1* 8/2010 Nakano ............... H01L 29/1608
257/77

2010/0301410 A1* 12/2010 Hirler ................. H01L 29/7813
257/334
2012/0037955 A1* 2/2012 Hirler ............... H01L 21/26506
257/140
2012/0049270 A1* 3/2012 Hirler ................. H01L 29/6634
257/328
2012/0181575 A1* 7/2012 Pfirsch ............... H01L 29/0834
257/139

FOREIGN PATENT DOCUMENTS

| | | |
|---|---|---|
| JP | 2011199041 A | 10/2011 |
| JP | 2012151470 A | 8/2012 |
| JP | 2013012590 A | 1/2013 |
| WO | 2013042333 A1 | 3/2013 |

* cited by examiner

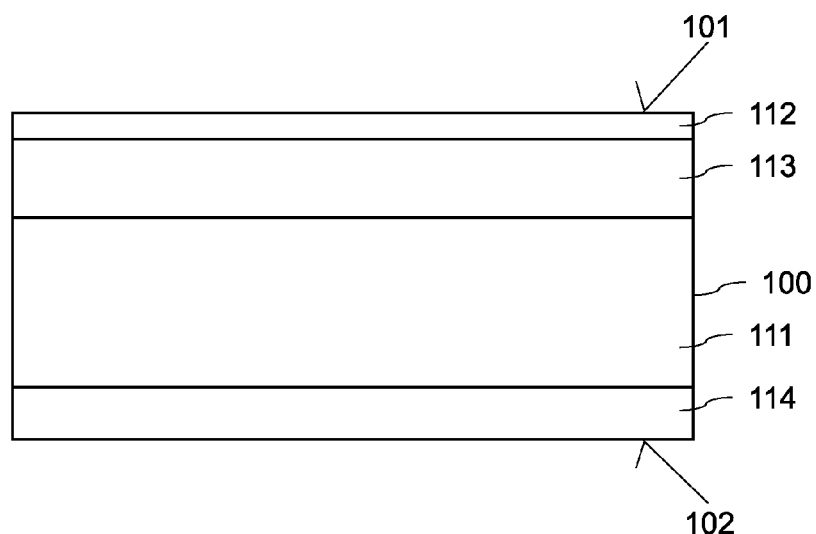
FIG 6A
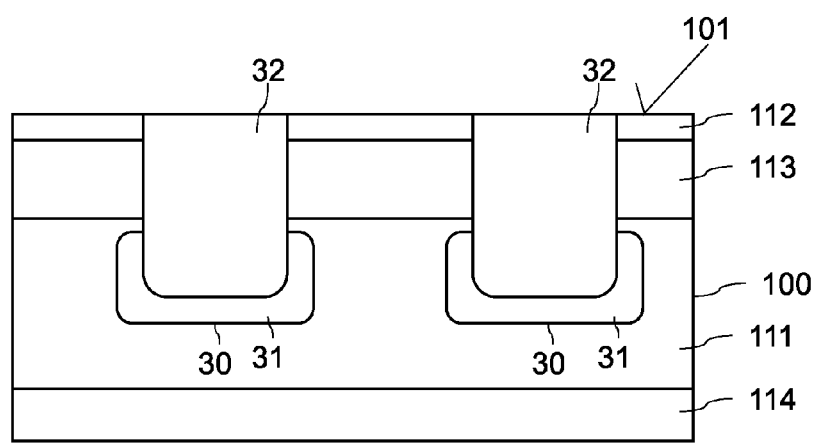
FIG 6B   y →

SEMICONDUCTOR DEVICE HAVING A LOWER DIODE REGION ARRANGED BELOW A TRENCH

PRIORITY CLAIM

This application claims priority to German Patent Application No. 10 2014 107 325.8 filed on 23 May 2014, the content said application incorporated herein by reference in its entirety.

TECHNICAL FIELD

Embodiments of the present invention relate to a semiconductor device, in particular a semiconductor device including a vertical transistor device and a diode connected in parallel with the transistor device.

BACKGROUND

Power transistors, which are transistors with voltage blocking capabilities of up to several hundred volts and with a high current rating, can be implemented as vertical MOS trench transistors. In this case, a gate electrode of the transistor can be arranged in a trench that extends in a vertical direction of the semiconductor body. The gate electrode is dielectrically insulated from source, body and drift regions of the transistor and is adjacent the body region in a lateral direction of the semiconductor body. A drain region usually adjoins the drift region, and a source electrode is connected to the source region.

In many applications it is desirable to have a diode connected in parallel to a load path (drain-source path) of the transistor. An integrated body diode of the transistor may be used for this purpose. The body diode is formed by a pn junction between the body region and the drift region. In order to connect the body diode parallel to the load path of the transistor, the body region may simply be electrically connected to the source electrode. The body diode, however, may have a current rating that is lower than desired in some applications.

Power transistors may be implemented with conventional semiconductor materials such as silicon (Si) or silicon carbide (SiC). Due to the specific properties of SiC, the use of SiC allows to implement power transistors with a higher voltage blocking capability (at a given on-resistance) than Si. High blocking voltages, however, result in high electric fields in the semiconductor body, specifically at the pn-junction between the body region and the drift region. Usually there are sections of the gate electrode and of the gate dielectric arranged close to this pn junction. Problems may occur, when the dielectric strength of the gate dielectric is not sufficient for a desired voltage blocking capability of the transistor device. In this case, the gate dielectric may breakdown early.

There is a need to provide a semiconductor device with a transistor device and a diode, wherein a gate electrode of the transistor is protected from high electric fields, and wherein the diode has a high current rating and low losses.

SUMMARY

One embodiment relates to a semiconductor device. The semiconductor device includes a semiconductor body and at least one device cell integrated in the semiconductor body. The at least one device cell includes a drift region, a source region, and a body region arranged between the source region and the drift region, a diode region, and a pn junction between the diode region and the drift region. The at least one device cell further includes a trench with a first sidewall, a second sidewall opposite the first sidewall, and a bottom, wherein the body region adjoins the first sidewall, the diode region adjoins the second sidewall, and the pn junction adjoins the bottom of the trench. A gate electrode of the at least one device cell is arranged in the trench and dielectrically insulated from the body region, the diode region and the drift region by a gate dielectric. The diode region includes a lower diode region arranged below the bottom of the trench which includes a maximum of a doping concentration distant to the bottom of the trench.

Another embodiment relates to a method of producing a semiconductor device. The method includes providing a semiconductor body with a drift region layer, a body region layer adjoining the drift region layer, and a source region layer adjoining the body region layer and forming a first surface of the semiconductor body. The method further includes forming at least one diode region such that the diode region extends from the first surface through the source region layer and the body region layer into the drift region layer, wherein the diode region and the drift region layer form one pn-junction, forming at least one trench having a first sidewall, a second sidewall opposite the first sidewall, and a bottom such that the at least one trench adjoins the body region layer on one of the first and second sidewalls, the diode region on the second sidewall and the pn-junction on the bottom. A gate electrode and a gate dielectric dielectrically insulating the gate electrode from the semiconductor body are formed in the at least one trench. Sections of the source region layer remaining after forming the diode regions) form source regions, and sections of the body region layer remaining after forming the at least one diode region form a body region Forming the at least one diode region comprises forming a lower diode region below the bottom of the trench, and forming a maximum of a doping concentration of the lower diode region distant to the bottom of the trench.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate the basic principle, so that only aspects necessary for understanding the basic principle are illustrated. The drawings are not to scale. In the drawings the same reference characters denote like features.

FIGS. 6A to 6J illustrate a method for producing a semiconductor device according to one embodiment.

DETAILED DESCRIPTION

In the following Detailed Description, reference is made to the accompanying drawings, which form a part thereof, and in which is shown by way of illustration specific embodiments in which the invention may be practiced.

Figure 1:
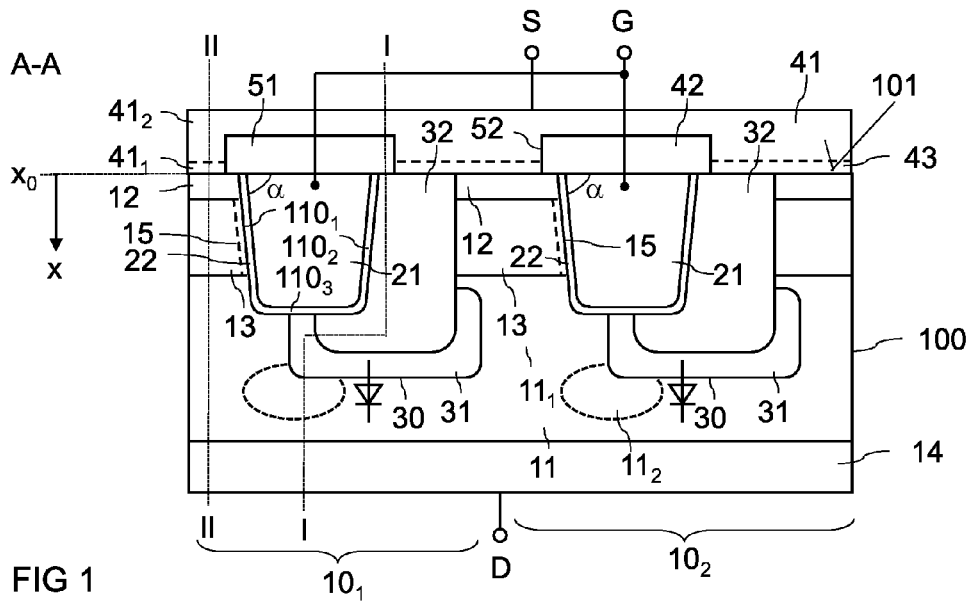
FIG. 1 illustrates a vertical cross sectional view of a semiconductor device according to a first embodiment.

FIG. 1 illustrates a vertical cross sectional view of a semiconductor device, specifically of a vertical semiconductor device, and more specifically of a vertical transistor device with an integrated diode. The semiconductor device includes a semiconductor body 100 with a first surface 101. Figure shows a section of the semiconductor device in a vertical section plane, which is a section plane perpendicular to the first surface. The semiconductor body 100 extends vertically, that is, in a direction perpendicular to the first surface 101, and horizontally, that is, in directions parallel to the first surface 101.

Referring to FIG. 1, the semiconductor device includes at least one device cell $10_1$, $10_2$ integrated in the semiconductor body 100. The device cell will also be referred to as transistor cell in the following. In FIG. 1, two device cells $10_1$, $10_2$ are illustrated. However, the semiconductor device may include more than two device cells, such as several ten, several hundred, several thousand, several ten thousand, several hundred thousand, or even several million device cells integrated in one semiconductor body 100.

In FIG. 1, the two device cells $10_1$, $10_2$ are labeled with different reference characters, while like features of the individual device cells $10_1$, $10_2$ are labeled with like reference characters. Referring to FIG. 1, each transistor cell $10_1$, $10_2$ includes a drift region 11, a source region 12 and a body region 13. The body region 13 is arranged between the source region 12 and the drift region 11. Each device cell $10_1$, $10_2$ further includes a diode region 30 and a pn junction formed between the diode region 30 and the drift region 11. In the embodiment of FIG. 1, the individual device cells $10_1$, $10_2$ share the drift region 11. That is, the individual device cells $10_1$, $10_2$ have one drift region 11 in common.

Referring to FIG. 1, each device cell $10_1$, $10_2$ further includes a gate electrode 21 arranged in a trench and dielectrically insulated from the body region 13, the diode region 30, and the drift region 11 by a gate dielectric 22. The trench with the gate electrode 21 of each device cell $10_1$, $10_2$ has a first sidewall $110_1$, a second sidewall $110_2$, opposite the first sidewall $110_1$ and a bottom $110_3$. The body region 13 of each device cell $10_1$, $10_2$ adjoins the first sidewall $110_1$ of the corresponding trench, the diode region 30 adjoins the second sidewall $110_2$ of the corresponding trench, and the pn junction between the drift region 11 and the diode region 30 adjoins the bottom $110_3$ of the corresponding trench.

Referring to FIG. 1, the diode region 30 of one device cell, such as device cell $10_1$ extends from a first surface 101 of the semiconductor body 100 adjacent the source region 12 and the body region 13 of a neighboring device cell, such as device cell $10_2$, into the drift region 11 where the pn junction is formed. An electrically insulating layer (insulation layer) 51 covers the first surface 101 and the gate electrodes 21. The insulation layer 51 has contact openings 52 where the insulation layer 51 uncovers the diode regions 32 and the source regions 12 of the individual device cells $10_1$, $10_2$. A source electrode 41 is formed on the insulation layer 51 and in the contact openings 52. The source electrode 41 is electrically insulated from the gate electrodes 21 by the insulation layer 51 and electrically connects the individual diode regions 30 and the individual source regions 12 to a source terminal S (only schematically illustrated in FIG. 1) or forms the source terminal S. Optionally, the source electrode 41 includes a first source electrode layer $41_1$ electrically contacting the diode regions 30 and the source regions 12, and a second source electrode layer $41_2$ electrically connecting the first source electrode layer $41_1$. The second source electrode layer $41_2$ is connected to the source terminal S or forms the source terminal S of the semiconductor device. The first electrode layer $41_1$ includes, e.g., titanium (Ti), platinum (Pt), nickel alloys, or the like. The second electrode layer $41_2$ includes, e.g., aluminum (Al), copper (Cu), or the like. In the embodiment shown in FIG. 1, the source electrode 41 is a planar electrode which contacts the source region 12 and the diode region 30 at the first surface 101. Optionally, the semiconductor body 100 includes a contact trench (not shown) which, from the first surface 101, extends at least into the diode regions. In this embodiment, the source electrode 41 extends into the trench.

Referring to FIG. 1, the semiconductor device further includes a drain region 14 adjoining the drift region 11. Optionally, a field-stop region (not illustrated) of the same doping type as the drift region 11 but more highly doped in the drift region 11 is arranged between the drift region 11 and the drain region 14. The drain region 14 is electrically connected to a drain terminal D (only schematically illustrated in FIG. 1). The individual device cells $10_1$, $10_2$ share one drain region 14. That is, there is one drain region 14 common to the individual device cells $10_1$, $10_2$.

The individual device cells $10_1$, $10_2$ are connected in parallel by having the source regions 12 connected to the source terminal S via the source electrode 41, by sharing the drain region 14 and having the drain region 14 connected to the drain terminal D, and by having the gate electrodes 21 electrically connected to a common gate terminal G. The connection of the gate electrodes 21 to the gate terminal G is only schematically illustrated in FIG. 1. One possible way to connect the gate electrodes 21 to the gate terminal G is explained with reference to FIGS. 2 and 3 herein below.

The semiconductor device shown in FIG. 1 is a MOS transistor device with an integrated diode. The transistor device can be implemented as an n-type device or as a p-type device. In an n-type device, the source regions and the drift region 11 are n-doped, while the body region 13 is p-doped. In a p-type device, the source regions 12 and the drift region 11 are p-doped, while the body regions 13 are n-doped. The transistor device can be implemented as an enhancement (normally-off) device or as a depletion (normally-on) device. In an enhancement device, the body regions 13 of the individual device cells $10_1$, $10_2$ adjoin the gate dielectric 22. In a depletion device there are channel regions 15 (illustrated in dashed lines in FIG. 1) of the same doping type as the source regions 12 and the drift region 11 along the gate dielectric 22. The channel region 15 of each device cell $10_1$, $10_2$ extends from the corresponding source region 12 to the drift region 11 along the gate dielectric 22 and is depleted of charge carriers when the transistor device is switched off. Alternatively, the gate dielectric 22 includes fixed charges that cause the generation of a conducting channel in the body region 13 along the gate dielectric 22 when the gate drive voltage (gate-source voltage) is zero.

Further, the transistor device can be implemented as a MOSFET or as an IGBT. In a MOSFET, the drain region 14 has the same doping type as the source regions 12 and the drift region 11, while in an IGBT the drain region 14 has a doping type complementary to the doping type of the source regions 12 and the drift region 11. In an IGBT, the drain region 14 is also referred to as collector region.

The diode regions 30 have the same doping type as the body regions 13, which is a doping type complementary to the doping type of the drift region 11. Since the diode region 30 of one device cell, such as device cell $10_1$ in FIG. 1, adjoins the body region 13 of a neighboring device cell, such as device cell $10_2$ in FIG. 1, the body region 13 of each device cell is electrically connected to the source electrode 41 through the diode region 30 of a neighboring device cell. Optionally, each diode region 30 includes two differently doped semiconductor regions, namely a first region 31 adjoining the drift region 11 and forming the pn junction with the drift region 11, and a second region 32 electrically connecting the first region 31 to the source electrode 41. The second region 32, which will also be referred to as contact region in the following, may have a higher doping concentration than the first region 31. In the embodiment shown FIG. 1, the contact region 32 of one device cell, such as device cell 101 in FIG. 1, adjoins the second sidewall of the corresponding trench and electrically connects the body region 13 of the neighboring device cell, such as device cell $10_2$ in FIG. 1, to the source electrode 41.

The diode region 30 of each device cell $10_1$, $10_2$ forms a bipolar diode with the drift region 11 and the drain region 14. A circuit symbol of this bipolar diode is also illustrated in FIG. 1 (the polarity of the circuit symbol illustrated in FIG. 1 relates to an n-type semiconductor device; in a p-type device the polarity is inverted). The diodes formed between the diode regions 30 of the individual device cells $10_1$, $10_2$ and the drift region 11 are connected in parallel and are connected in parallel with a load path (drain-source path) of the MOS transistor. The drain-source path of the MOS transistor is an internal path between the drain terminal D and the source terminal S. The individual diodes are reverse biased (block) when a voltage with a first polarity is applied between the drain and source terminals D, S of the MOS transistor, and the individual diodes are forward biased (conduct) when a voltage with a second polarity is applied between the drain and source terminals D, S. In an n-type semiconductor device, the diodes are reverse biased when a positive voltage is applied between the drain and source terminals D, S, and the diodes are forward biased when a negative voltage is applied between the drain and source terminals D, S (which is a positive voltage between the source and drain terminals S, D). The individual diodes are parallel to the body diodes of the transistor cells. The body diodes are the diodes formed by the body regions 13 and the drift region 11 of the individual device cells $10_1$, $10_2$. However, unlike the body diodes, the properties of the diodes between the diode regions 30 and the drift region 11 can be adjusted widely independent of the properties of the MOS transistor. Specifically, the diodes between the diode regions 30 and the drift region 11 can be implemented to have a high current rating by implementing the diode region 30 such that the pn junction between the diode region 30 and the drift region 11 has a relatively large area.

The semiconductor device of FIG. 1 can be operated like a conventional MOS transistor by applying a load voltage between the drain and source terminals D, S and by applying a drive potential to the gate electrode G. One way of operation is briefly explained with reference to an n-type semiconductor device. This way of operation, however, also applies to a p-type device, where in a p-type device the polarities of the voltages explained in the following are inverted. The semiconductor device is in a forward operation mode when a load voltage is applied between the drain and source terminals D, S that reverse biases the body diodes and the additional diodes (the diodes between the diode regions 30 and the drift region 11) of the individual device cells $10_1$, $10_2$. This voltage is a positive voltage in an n-type device. In the forward operation mode, the MOS transistor can be switched on and off through the drive potential applied to the gate terminal G. The MOS transistor is switched on (in an on-state) when the drive potential applied to the gate terminal G generates conducting channels in the body regions 13 between the source regions 12 and the drift region 11, and the MOS transistor is switched off (in an off-state) when the conducting channel in the body regions 13 are interrupted. The absolute value of the drive potential that switches on or switches off the transistor device is dependent on the specific type of the transistor device (enhancement device or depletion device).

The semiconductor device is in a reverse operation mode when a voltage is applied between the drain and source terminals D, S that forward biases the body diodes and the additional diodes. In this operation mode, the semiconductor device can only be controlled through the polarity of the load voltage, but not through the drive potential applied to the gate terminal G.

When the semiconductor device is in the forward operation mode and when the semiconductor device is switched off, the pn-junctions between the diode regions 30 and the drift region 11 and the pn-junctions between the body regions 13 and the drift region 11 are reverse biased so that a depletion region expands in the drift region 11 beginning at the pn-junctions. When the load voltage increases, the depletion region expands deeper into the drift region 11 in the direction of the drain region 14. When the load voltage increases and the depletion region expands deeper into the drift region 11, the electric field strength at the pn-junctions also increase. Since the pn-junctions between the body regions 13 and the first drift region 11 is close to the gate dielectric 22, the gate dielectric 22 may be damaged when high load voltages are applied, that is when high field strengths occur. In the semiconductor device of FIG. 1, however, the diode regions 30 of two neighboring device cells $10_1$, $10_2$ together with the drift region 11 act as a JFET (Junction Field-Effect Transistor). This JFET has channel regions $11_1$ between two neighboring diode regions 30. As the load voltage increases and as the electrical potential of the drift region 11 increases, the JFET pinches off the channel regions $11_1$ and prevents a field strength of an electric field at the pn-junctions between the body regions 13 and the drift region 11 to further increase when the load voltage further increases.

The load voltage at which the channels $11_1$ of the JFET pinch off, is, for example, dependent on a distance between two neighboring diode regions 30 in a lateral direction of the semiconductor body 100. The "lateral direction" of the semiconductor body 100 is perpendicular to the vertical direction (in which the drain region 14 is spaced from the body regions 13 and the diode regions 30) and is essentially parallel to the first surface 101. This lateral distance between two neighboring diode regions 30 is, for example, between 0.5 μm (micrometers) and 2 μm (micrometers) or between 0.25 times and 1.5 times the width of the trenches accommodating the gate electrodes 21. The "width" of the trenches is the distance between the first and second sidewalls $110_1$, $110_2$. In case the trenches are tapered, as illustrated in the embodiment of FIG. 1, the width is either the largest distance between the first and second sidewalls $110_1$, $110_2$ or the average of the width. According to another embodiment, the lateral distance between two neighboring diode regions 30 is between 30% and 60% of a dimension (width) of the diode regions 30 in the lateral direction in the drift region 11 below the trenches 110. In case the diode regions have a varying width in the drift region 11, the width is either the maximum width or the average width.

Each device cell $10_1$, $10_2$ includes a channel region, which is a region of the body region 13 along the gate dielectric 22 or which is the optional channel region 15 (illustrated in dashed lines in FIG. 1). The channel region along the gate dielectric 22 enables charge carriers to flow from the source regions 12 to the drift region 11 when the transistor device is in the on-state. The diode region 30 of each device cell $10_1$, $10_2$ does not overlap the channel region. That is the pn junctions between the diode regions 30 and the drift region 11 adjoin the bottoms $110_3$ of the individual gate trenches and do not extend beyond the gate trenches in the direction of the channel regions. Thus, the diode regions 30 do not constrain a charge carrier flow from the channel regions to the drain region 14.

The voltage blocking capability of the semiconductor device is, inter alia, dependent on a distance between the diode regions 30 and the drain region 14. This distance can be adjusted in the manufacturing process in accordance with the desired voltage blocking capability. As a rule of thumb, in a SiC semiconductor body 100, the distance between the drain region 14 and diode region 30 is between 0.8 micrometers and 1.0 micrometers per 100V voltage blocking capability.

The semiconductor body 100 may include a conventional semiconductor material, in particular a wide bandgap semiconductor material, such as silicon carbide (SiC), or the like. The device topology illustrated in FIG. 1 is, in particular, suitable for semiconductor devices implemented with SiC technology. When, e.g., the semiconductor body 100 includes SiC, the gate dielectric 22 may be implemented as a silicon oxide ($SiO_2$). A gate dielectric 22 of $SiO_2$ may suffer from degradation when exposed to high field strengths that may occur in high voltage devices. In such devices, the JFET formed by the diode regions 30 and the drift region 11 efficiently protects the gate dielectric 22 when the semiconductor device is switched off and a high load voltage is applied between the drain and source terminals D, S. In the reverse operation mode, the additional diode that is directly connected to the source electrode 41 is a highly efficient diode with low losses connected in parallel to the load path of the MOS transistor.

The doping concentration of the drift region 11 is, for example, between $1E14\ cm^{-3}$ and $1E17\ cm^{-3}$. The doping concentration of the body regions 13 is, for example, between $5E16\ cm^{-3}$ and $5E17\ cm^{-3}$. The doping concentrations of the source and drain regions 12, 14 are, for example, higher than $1E19\ cm^{-3}$. The doping concentration of the diode regions 30 is, for example, between $1E18\ cm^{-3}$ and $1E19\ cm^{-3}$.

Referring to FIG. 1, the body region 13 of each device cell $10_1$, $10_2$ adjoins the corresponding gate trench at the first sidewall $110_1$. Especially when the gate trenches have tapered sidewalls, the first and second sidewalls $110_1$, $110_2$ may correspond to different crystal planes of a crystal lattice of the semiconductor body 100. According to one embodiment, the semiconductor body 100 includes a hexagonal SiC crystal and the gate trenches have tapered sidewalls, such that the first sidewall $110_1$ corresponds to the 11-20-plane in the SiC crystal. In this case the individual channel regions feature a relatively low resistance. In this embodiment, the first sidewall $110_1$ is aligned with the c-axis of the crystal of the SiC semiconductor body. The c-axis (hexagonal main axis) is perpendicular to the growth plane (0001-plane) of the SiC crystal. This growth plane is not illustrated in FIG. 1. The bottom $110_3$ of the trench is essentially parallel to the first surface 101.

An angle α (alpha) between the first sidewall $110_1$ and the first surface 101 of the trench 110 is dependent on an orientation of the first surface relative to the growth plane (0001-plane). According to one embodiment, the first surface 101 is inclined relative to the growth plane, where an angle between the first surface 101 and the growth plane may be between 1° and 10°, in particular between 2° and 8°. In this case α is between 80° (90°-10°) and 89° (90°-1°), and in particular between 82° (90°-8°) and 88° (90°-2°). According to one specific embodiment, the angle between the first surface 101 and the growth plane is 4°, so that the angle α between the first surface 101 and the first sidewall $110_1$ of the trench 110 is 86°. There is a high charge carrier mobility in the SiC crystal along the 11-20 plane (which may also be written as (11 −20) plane) so that the alignment of the first sidewall to the c-axis results in a low resistance in the channel region along the gate dielectric 22 in the body region 13.

Figure 2:
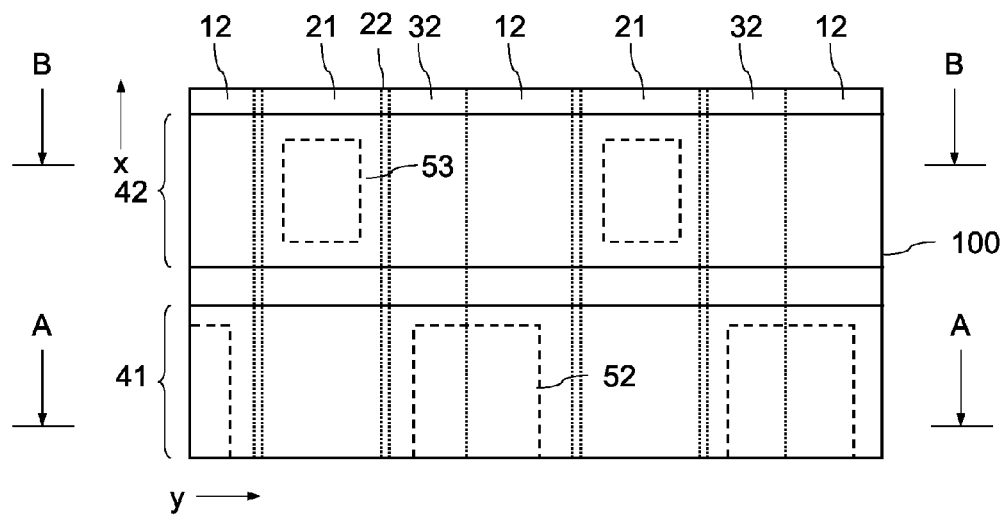
FIG. 2 illustrates a horizontal cross sectional view of one embodiment of the semiconductor device of FIG. 1.

The gate trenches can be elongated trenches, wherein the gate electrodes 21 can be connected to a gate terminal electrode at positions that are out of view in the vertical cross sectional view of FIG. 1. FIG. 2 shows a horizontal cross sectional view of one embodiment of the semiconductor device of FIG. 1 that includes elongated gate trenches. FIG. 2 illustrates features of the semiconductor device in three different horizontal layers of the semiconductor body 100. In FIG. 2, the gate electrodes 21 and the gate dielectrics 22 are illustrated in dotted lines. As can be seen from FIG. 2, the gate trenches with the gate electrodes 21 and the gate dielectric 22 are elongated trenches. The source regions 12 and the diode regions 30 with the optional contact regions 32 run parallel to the gate trenches. FIG. 2 further illustrates (in dashed lines) contact openings 52, 53 of the insulation layer 51. Referring to FIG. 2, there are first contact openings 52 above the source regions 12 and the diode regions 30, specifically the contact regions 32 of the diode regions, and second contact openings 52 above the gate electrodes 21. The second openings 53 are spaced apart from the first openings 52 in a first lateral direction x of the semiconductor body 100. The individual gate trenches and the individual diode regions 30 are spaced in a second lateral direction y that is perpendicular to the first lateral direction x, in the present embodiment. Referring to FIGS. 1 and 2, the source electrode 41 covers the insulation layer 51 in those regions where the first contact openings 52 are located and is electrically connected to the contact regions 32 and the source regions 12 in the first contact openings 52.

A gate connection electrode (gate runner) 42 is spaced apart from the source electrode 41 in the first lateral direction x and covers the insulation layer 51 in those regions where the second contact openings 52 are arranged. The gate connection electrode 42 is electrically connected to the gate electrodes 21 in the second contact openings 53. Referring to FIG. 2, the source electrode 41 and the gate connection electrode 42 may be essentially parallel.

Figure 3:
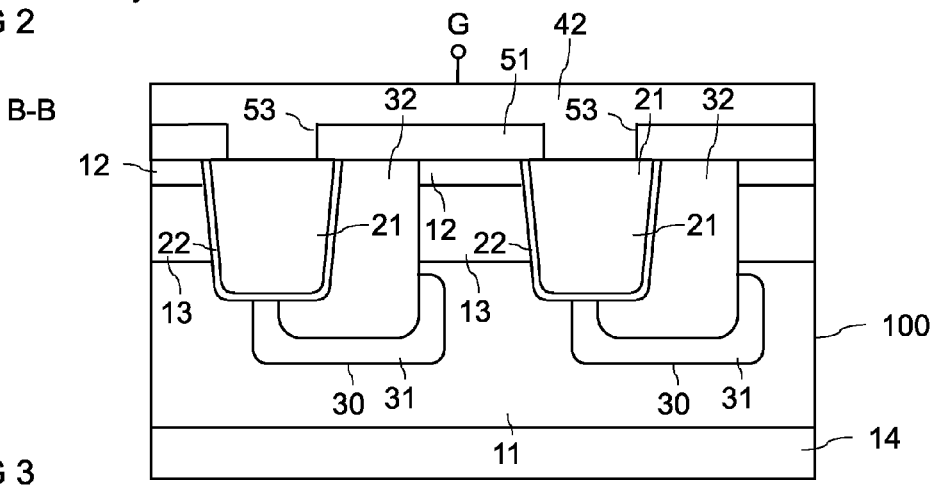
FIG. 3 illustrates a vertical cross sectional view of the semiconductor device of FIG. 2 in a section plane other than the section plane illustrated in FIG. 1.

The vertical cross sectional view illustrated in FIG. 1 corresponds to a vertical cross sectional view in section plane A-A illustrated in FIG. 2. FIG. 3 illustrates a vertical cross sectional view in section plane B-B illustrated in FIG. 2, where section plane B-B cuts through the gate connection electrode 42 and the second contact openings 53. Referring to FIG. 3, the insulation layer 51 separates the diode regions 30 and the source regions 12 from the gate connection electrode 42, and the gate connection electrode 42 is electrically connected to the gate electrodes 21 through the second contact openings 53.

According to one embodiment, the semiconductor device includes one source electrode 41 connected to the source terminal S, and one gate connection electrode 42 connected to the gate terminal G. According to a further embodiment (not illustrated), the semiconductor device includes several gate connection electrodes 42 each connected to the gate terminal G, and several source electrodes 41 each connected to the source terminal S where the gate connection electrodes 42 and the source electrodes 41 are essentially parallel and are arranged alternatingly in the first lateral direction x.

Referring to FIGS. 1 and 2, the diode region 30 includes a region which, in the vertical direction of the semiconductor body 100, is located below the bottom $110_3$ of the trench. The "vertical direction" of the semiconductor body 100 is the direction perpendicular to the first surface 101 of the semiconductor body 100. This region of the diode region 30 below the bottom $110_3$ will be referred to as "lower diode region" in the following. In an embodiment, in which the diode region 30 includes a first diode region 31 and a second diode region 32, the lower diode region may include sections of the first diode region 31 and the second diode region 32.

According to one embodiment, the lower diode region, in the vertical direction, has a varying doping concentration such that a region, where the lower diode region has a maximum doping concentration is spaced apart from the bottom $110_3$ of the trench. This is explained with reference to FIG. 4 below.

Figure 4:
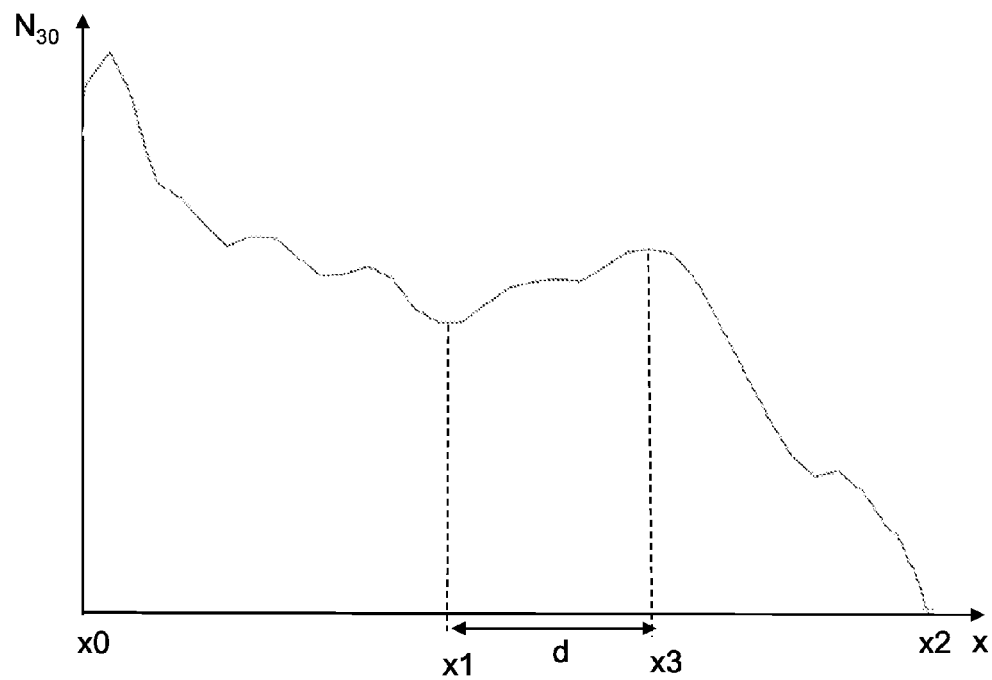
FIG. 4 illustrates one embodiment of a doping concentration of a diode region of the semiconductor device.

FIG. 4 illustrates the doping concentration $N_{30}$ of the diode region 30 along a line I-I shown in FIG. 1. In FIG. 4, x represents the distance between the first surface 101 and the individual positions for which the doping concentrations are illustrated in FIG. 4. x0 denotes the position of the first surface 101, and x1 denotes the position of the trench bottom $110_3$, and x2 denotes a lower end of the diode region 30 where the diode region 30 forms the pn-junction with the drift region. In FIG. 4, only the doping concentration of the dopants forming the diode region 30 are illustrated. As stated above, these dopants are p-type dopants in an n-type transistor device, and an n-type dopants in a p-type transistor device. Referring to FIG. 4, the doping concentration of the diode region 30 has a maximum in the lower diode region 30 at a position spaced apart from the trench bottom $110_3$. A shortest distance d between trench bottom $110_3$ and the position x3 of the maximum is, for example, between 200 nanometers (nm) and 1 micrometer (μm), in particular, between 250 nanometers and 500 nanometers. According to one embodiment, this maximum doping concentration in the lower diode region is between $1E18$ cm$^{-3}$ and $5E18$ cm$^{-3}$.

Referring to FIG. 4, the maximum of the doping concentration in the lower diode region may be a local maximum of the overall diode region 30. That is, the diode region may include an absolute maximum of the doping concentration or further local maximums of the doping concentration region which are outside the lower diode region and higher than the maximum doping concentration in the lower diode region 30. In the embodiment shown in FIG. 4, the diode region 30 has an absolute maximum of the doping concentration close to the first surface 101. This region which has the absolute maximum the doping concentration serves as a contact region in which the source electrode 1 electrically connects to the diode region 30. The maximum doping concentration in this region is, for example, between $1E19$ cm$^{-3}$ and $1E20$ cm$^{-3}$. According to one embodiment, there is a (local) minimum of the doping concentration between the trench bottom $110_3$ and the position x3 with the (local) maximum doping concentration. This minimum doping concentration, according to one embodiment, is in a region adjacent the trench bottom. According to one embodiment, this minimum doping concentration is between $5E17$ cm$^{-3}$ and $1E18$ cm$^{-3}$.

Implementing the diode region 30 with a local maximum of the doping concentration of the lower diode region spaced apart from the trench bottom $110_3$ helps to effectively protect the gate dielectric 22 from high electric fields when the semiconductor device is blocking.

Figure 5:
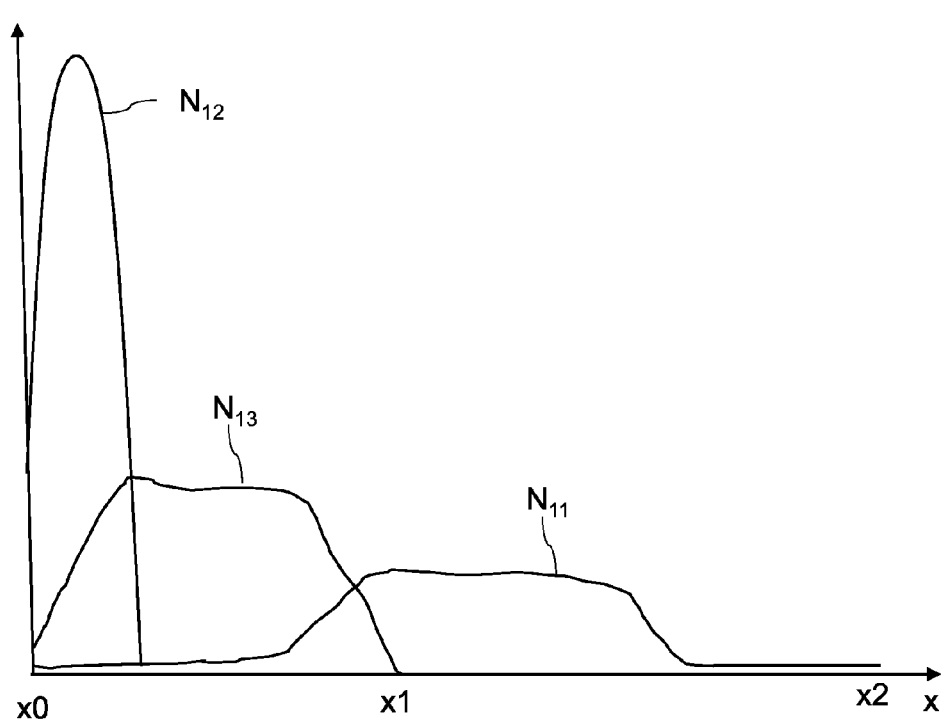
FIG. 5 illustrates one embodiment of a doping concentration of a channel region and drift region of the semiconductor device.

According to one embodiment, the drift region 11 has a locally increased doping concentration in the channel region $11_1$. This is explained with reference to FIG. 5 below. FIG. 5 shows the doping concentration along a line II-II shown in FIG. 1. In FIG. 5, the doping concentrations $N_{12}$ of the source region 12, $N_{13}$ of the body region 13, and $N_{11}$ of the drift region 11 are illustrated. As in FIG. 4, x0 denotes the position of the first surface 101, x1 denotes the position of the trench bottom $110_3$, and x2 denotes a position of the lower end of the diode region 30. Referring to FIG. 5, the drift region 11, in a region adjoining the body region 13 has a higher doping concentration than in regions farther down the drift region 11 in the direction of the drain region 14. That is, the drift region 11 has a maximum of the doping concentration in a region between the pn-junction at the border between the body region 13 and the drift region 11 and a vertical position corresponding to the vertical position of the lower end of the diode region 30. A length of this region with an increased doping concentration is, for example, between 200 nanometers and 1 micrometer. The doping concentration in this region is, for example, at least 2 times the doping concentration outside the channel region $11_1$. According to one embodiment, the doping concentration in the higher doped section of the channel region $11_1$ is between $5E16$ cm$^{-3}$ and $1E17$ cm$^{-3}$. Outside the channel region $11_1$, the doping concentration of the drift region 11 is, for example, below $2E16$ cm$^{-3}$. The higher doping of the channel region $11_1$ helps to reduce the on-resistance of the semiconductor device, which is the electrical resistance in the on-state of the semiconductor device. According to one embodiment, the higher doped section of the channel region $11_1$ covers the vertical position x3 where the lower diode region has the doping maximum.

According to another embodiment, the drift region 11 includes a further higher doped region $11_2$ below the diode region 30. This further higher doped region $11_2$ may adjoin the diode region 30 and, in a lateral direction may extend beyond the diode region 30 in the direction of the channel region $11_1$. The doping concentration of this further higher doped region $11_2$ may correspond to the doping concentration of the higher doped region in the channel region $11_1$. This further higher doped region $11_2$ may be spaced apart from the higher doped region in the channel region $11_1$.

One embodiment of a method for producing a semiconductor device as explained herein before is explained with reference to FIGS. 6A to 6J in the following. Each of these figures shows a vertical cross sectional view of the semiconductor body 100 during individual method steps of the method.

Referring to FIG. 6A, the method includes providing a semiconductor body 100 with a drift region layer 111, a body region layer 113 adjoining the drift region layer 111, and a source region layer 112 adjoining the body region layer 113. The source region layer 112 forms a first surface 101 of the semiconductor body 100. The semiconductor body 100 further includes a drain region layer 114 adjoining the drift region layer 111 opposite the body region layer 113. Optionally, a field stop region layer (not illustrated) of the same doping type as the drift region layer 111, but more highly doped than the drift region layer 111 is arranged between the drain layer region 114 and the drift region layer 111. The drift region layer 111 forms the drift region 11, the body region layer 113 forms the body regions 13, the source region layer 113 forms the source regions 12, and the drain region layer 114 forms the drains region 14 of the finished semiconductor device. The doping types and the doping concentrations of the individual semiconductor layers 111-114 corresponds to the doping types and doping concentrations of the device regions formed by the individual semiconductor layers. These doping types and the doping concentrations of the individual device regions have been explained herein before.

The semiconductor body 100 of FIG. 6A can be produced using conventional techniques for producing a semiconductor body having several differently doped semiconductor layers. According to one embodiment, producing the semiconductor body 100 includes providing a semiconductor substrate that forms the drain region layer 114, growing the drift region layer 111 as a first epitaxial layer on the drain region layer 114, growing the body region layer 113 as second epitaxial layer on the drift region layer 111, and growing the source region layer 112 as a third epitaxial layer on the body region layer 113. The individual epitaxial layers can be in-situ doped during the individual epitaxial processes.

According to a second embodiment, a semiconductor substrate is provided that has a doping concentration corresponding to the doping concentration of the drift region layer 111. By implantation processes doping atoms are implanted through the first surface 101 into this substrate, so as to form the body region layer 113 and the source region layer 112. Additionally, doping atoms are implanted into the substrate through a second surface 102 opposite the first surface 101 in order to form the drain region layer 114.

According to a third embodiment, a semiconductor substrate is provided that forms the drain region layer 114. An epitaxial layer is grown on the drain region layer 114, where the epitaxial layer has a doping concentration corresponding to the doping concentration of the drift region layer 111. This epitaxial layer forms the first surface 101 of the semiconductor body 100. Finally, doping atoms are implanted through the first surface 101 into the epitaxial layer, so as to form the body region layer 113 and the source region layer 112.

Referring to FIG. 6B, diode regions 30 that are spaced in the second lateral direction y of the semiconductor body 100 are formed. Forming the diode regions 30 may include forming a first diode region 31 in the drift region layer 111, and forming a second diode region (contact region) 32, where the contact region 32 extends from the first surface 111 through the source region layer 112 and the body region layer 113 into the first diode region 31. Forming the first and second diode regions 31, 32 may include conventional implantation processes. An embodiment of a method for producing the diode regions 30 is explained with reference to FIGS. 7A and 7B herein further below.

Figure 6C:
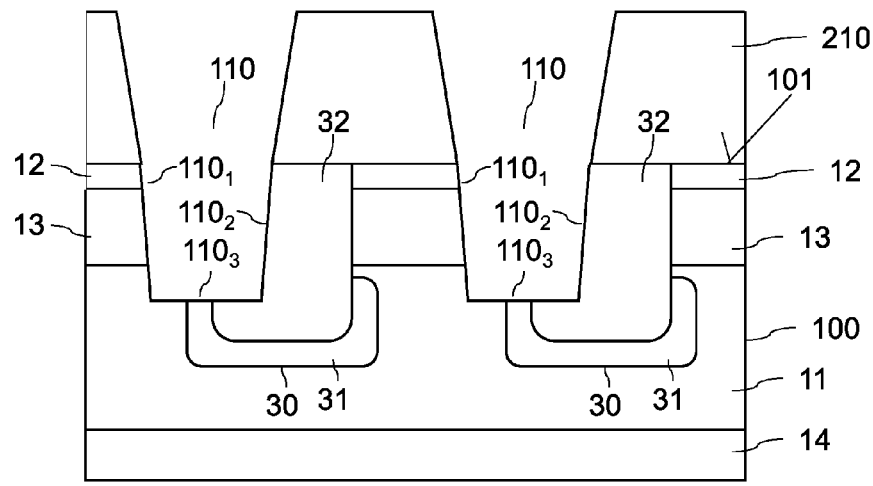

Referring to FIG. 6C, the method further includes producing trenches in the first surface 101 of the semiconductor body 100. The trenches each include a first sidewall $110_1$, a second sidewall $110_2$ opposite the first sidewall $110_1$, and a bottom $110_3$. The trenches subdivide the body region layer 113 and the source region layer 112 into several sections, wherein those regions that have the doping concentration of the body region layer 113 before forming the diode regions 30 form body regions 13, and those regions that have the doping concentration of the source region layer 112 before forming the diode region 30 form source regions 12 of the semiconductor device. Referring to FIG. 6C, the trenches 110 are formed such that the first sidewall $110_1$ of each trench 110 adjoins one source region 12 and one body region 13 and that the second sidewall $110_2$ of each trench 110 adjoins one diode region 30, specifically the contact region 32 of the diode region 30. In this case, a pn junction formed between the diode region 30 and the drift region 11 adjoins the bottom $110_3$ of each trench 110. Forming the trenches 110 may include conventional etching processes using an etch mask 210.

Figure 6D:
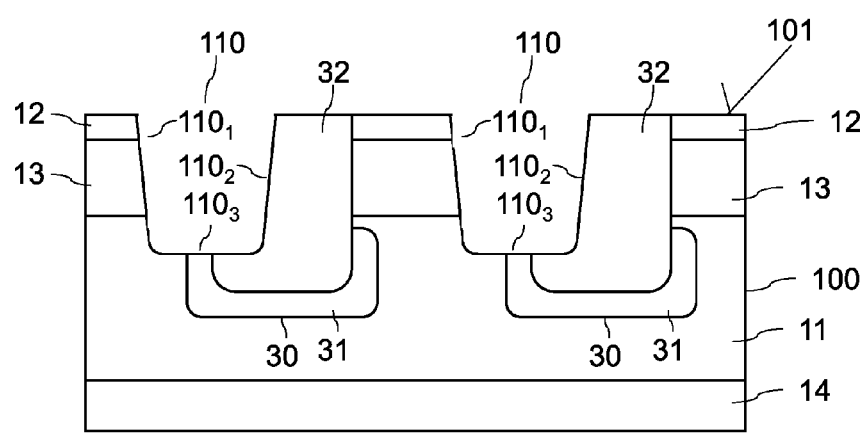

Optionally, there is a post processing of the trenches 110 in which corners between the sidewalls $110_1$, $110_2$ and the bottom $110_3$ of the individual trenches are rounded. The result of such a rounding process is illustrated in FIG. 6D. The rounding process may include a thermal treatment in a hydrogen containing atmosphere. A temperature in this thermal treatment is, for example, between 1200° C. and 1700° C., the duration is, for example, between 1 minute and 60 minutes. According to one embodiment, the corners between the sidewalls $110_1$, $110_2$ and the bottom $110_3$ are formed with radius that is at least two times the thickness or at least four times the thickness the gate dielectric 22 has along the first surface $110_1$. The gate dielectric 22 is formed in process steps explained below. According to one embodiment, a radius of the corners is at least 300 nanometers (nm). This process not only rounds the corners at the bottom of the trench, but also the corners between the first surface 101 and the sidewalls $110_1$, $110_2$.

According to one embodiment, the trenches 110 are formed with tapered sidewalls. According to one embodiment, the semiconductor body 100 includes SiC, and the trenches 110 are formed with tapered sidewalls such that the first sidewalls $110_1$ are aligned with the c-axis of the SiC semiconductor crystal.

Forming the trenches with tapered sidewalls may include an etching process which etches the semiconductor body in the vertical direction at a first etch rate and in the lateral direction at a second etch rate lower than the first etch rate. As the sidewalls $110_1$, $100_2$ of the trench closer to the first surface 101 are subject to the etching agent longer than sections closer to the bottom $110_3$, the trench becomes wider at the first surface 101 than at the bottom $110_3$. Dependent on the accuracy of the etching process, dependent on how exactly the first surface 101 of the semiconductor body 100 is aligned with a desired crystal plane, and dependent on how exactly the semiconductor body 100 is aligned with an etching mask (not shown) in the etching process the first sidewall $110_1$ may or may not exactly fit the crystal plane in which the channel region is desired to be implemented.

According to one embodiment, forming the trenches includes an adjustment process which serves to align the first sidewall $110_1$ with the above mentioned crystal plane, that is, the 11-20 plane. This process, after forming the trenches, may include a thermal treatment in a hydrogen containing atmosphere. In the thermal treatment, a temperature is, for example, between 1200° C. and 1700° C., and the duration is, for example, between 1 minute and 60 minutes. According to one embodiment, the same thermal treatment is used for rounding the corners of the trenches and for fine tuning the alignment of the first sidewall $110_1$.

Figure 6E:
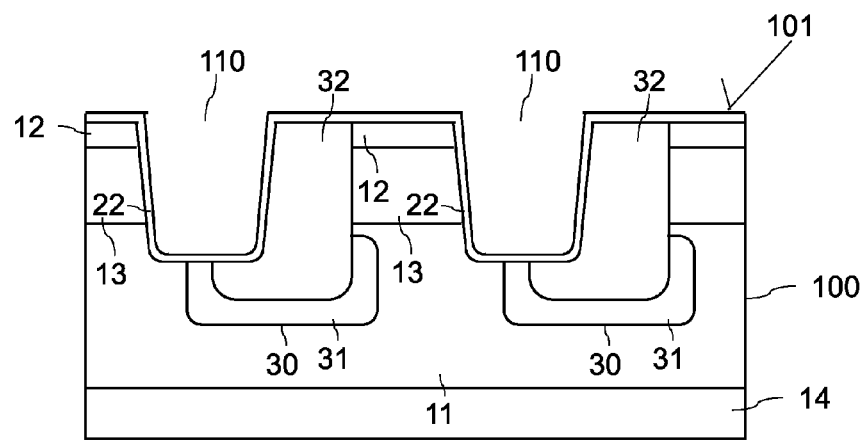
Figure 6F:
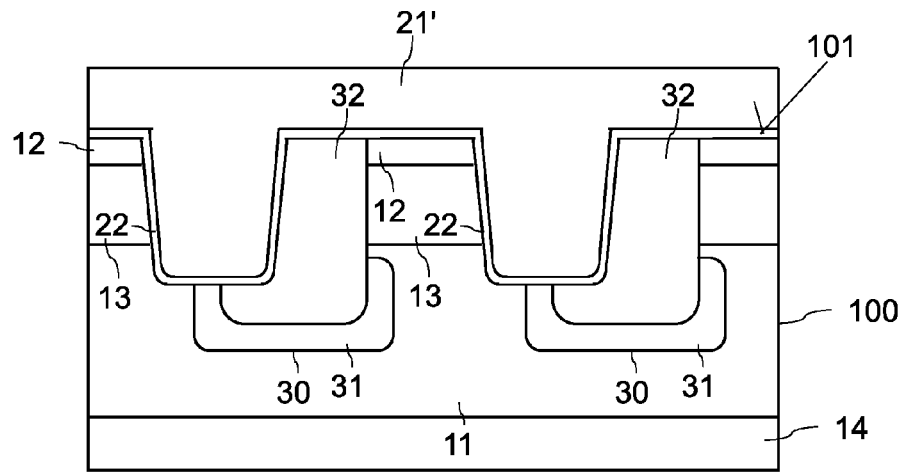

In next process steps illustrated in FIG. 6E, the gate dielectric 22 is formed on the sidewalls $110_1$, $110_2$ and the bottom $110_3$ of the trenches 110. Optionally, the gate dielectric 22 is also formed on the first surface 101 of the semiconductor body 100. According to one embodiment, the semiconductor body 100 includes SiC, and the gate dielectric 22 includes silicon dioxide ($SiO_2$). Forming the gate dielectric 22 may include an oxidation process, a deposition process, or a combination of a deposition process and an oxidation process Referring to FIG. 6F, an electrode layer 21' is formed in the trenches 110 and above the first surface 101 of the semiconductor body 100. Those sections of the electrode layer 21' that are located in the trenches 110 form the gate electrodes 21 of the individual device cells. For example, the electrode layer 21' includes a highly doped polycrystalline semiconductor material, such as polysilicon, or a silicide.

Figure 6G:
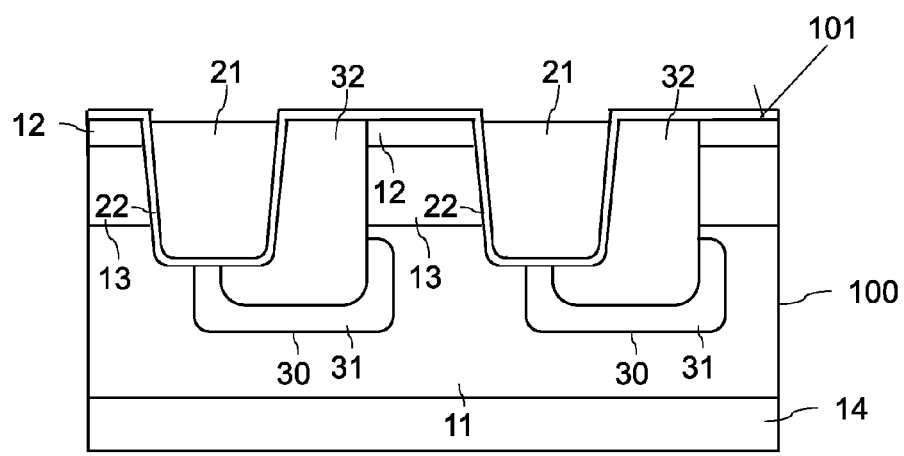

Referring to FIG. 6G, the electrode layer 21' is removed from the first surface 101 but remains in the trenches where it forms the gate electrodes 21. Removing the electrode layer 21' above the first surface 101 may include an etching process such as a dry etching process.

Figure 6H:
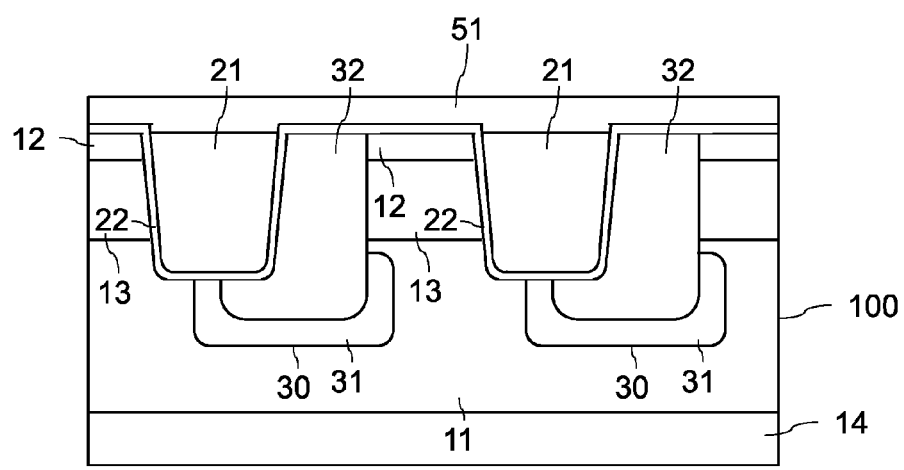

Referring to FIG. 6H, the insulation layer 51 is formed above the first surface 101 and the gate electrodes 21. The insulation layer 42 may be a conventional electrically insulating layer, such as an oxide. Forming the insulation layer 51 may include a chemical vapor deposition (CVD).

Figure 6I:
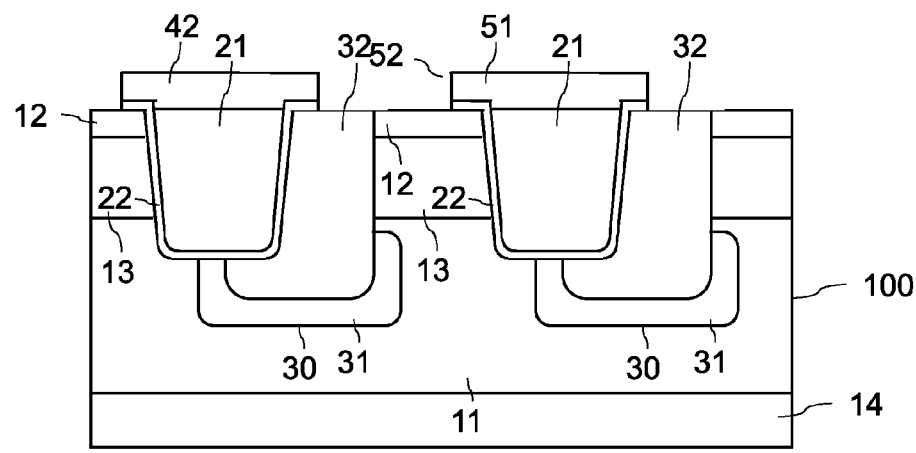
Figure 6J:
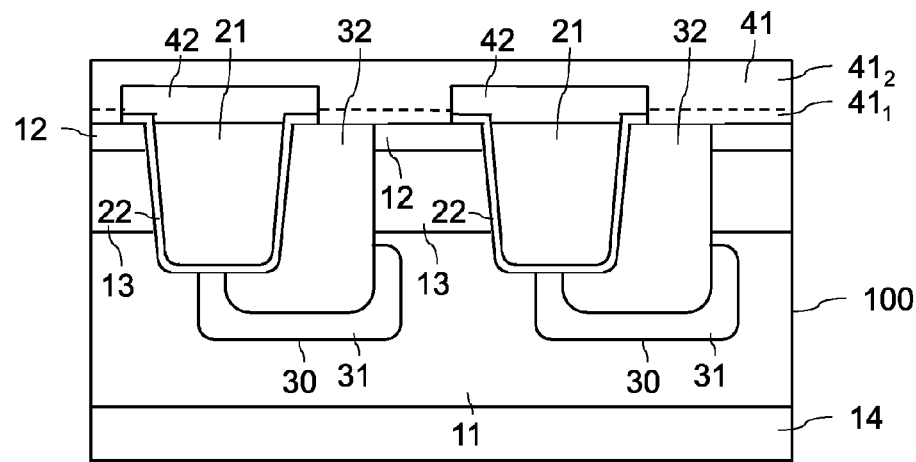

Referring to FIG. 6I, contact holes 52 are formed in the insulation layer 51. Forming the contact holes may include conventional etching processes using etch masks. FIG. 6I illustrates forming the first contact holes 52 above the diode regions 30 and the source regions 12. Equivalently, the second contact holes 53 are formed above the gate electrode 21 in regions that are out of view in the vertical cross section of FIG. 6I.

Finally, the source electrode 41 is formed. The source electrode 41 electrically contacts the diode regions 30 and the source regions 12 in the first contact openings 43. Optionally, the source electrode 41 includes the two sub-layers $41_1$, $41_2$ explained before. Forming the source electrode 41 may include a metal deposition process, such as one of a CVD process, an evaporation process, a galvanic process and a sputter process. The source electrode 41 includes an electrically conductive material, such as a metal or a silicide. Equivalently, the gate connection electrode 42 is formed in regions that are out of view in FIG. 6J and contacts the gate electrodes 21 in the second contact openings 53.

In the method explained before, the vertical position x3 (see, FIG. 4) and the doping concentration of the doping maximum in the lower diode region 30 can be adjusted in the implantation process explained with reference to FIG. 6B. In particular, the vertical position can be adjusted by adjusting the implantation energy of those ions that are implanted to form the doping maximum, and the doping concentration can be adjusted by adjusting the implantation dose. It should be noted that forming one diode region 30 may include several implantation processes which may be different in view of implantation energy and implantation dose so as to form a diode region 30 with doping concentration that varies in the vertical direction of the semiconductor body.

Figure 7A:
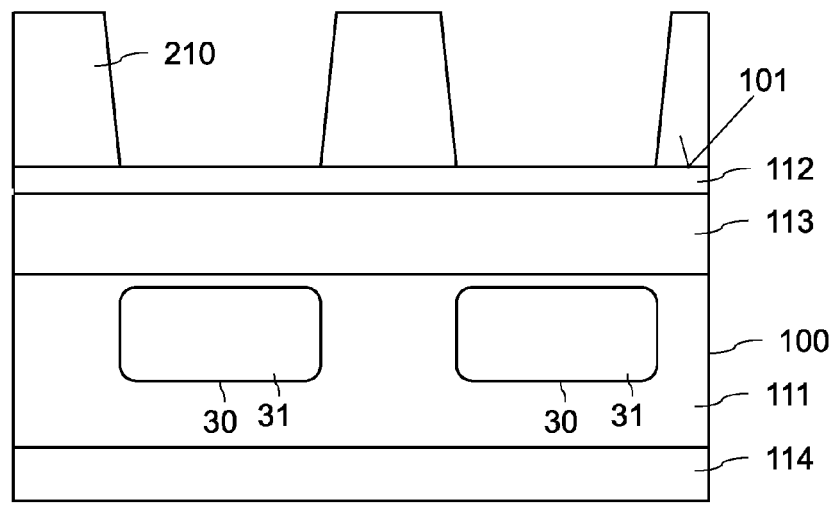
FIGS. 7A and 7B illustrate one embodiment of a method for producing a semiconductor device structure illustrated in FIG. 6B.
Figure 7B:
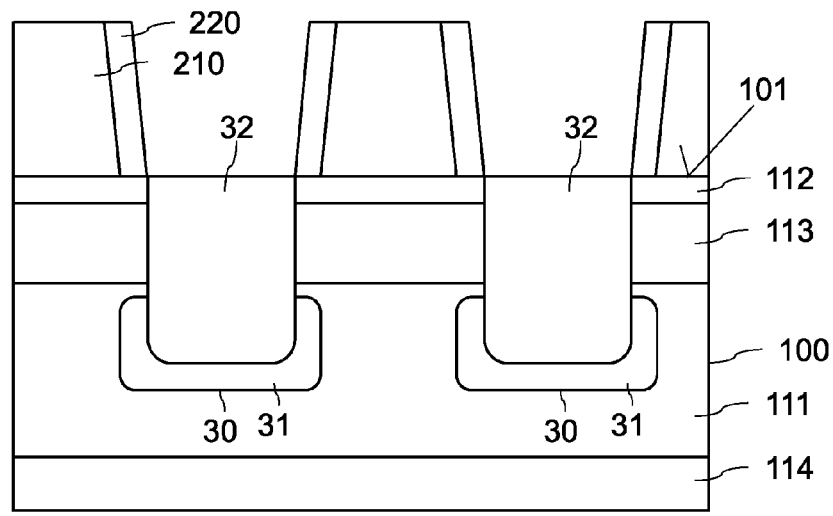

FIGS. 7A and 7B illustrate one embodiment of a method for producing the diode regions 30. In the method shown in FIGS. 7A and 7B, the diode regions 30 are formed with a first diode region 31 and a second diode region 32. Referring to FIG. 7A, forming the first diode region 31 may include at least one implantation process using an implantation mask 210. The implantation energy of this implantation process is adjusted such that the doping atoms are implanted into the drift region layer 111.

Referring to FIG. 7B, forming the second diode regions (contact regions) 32 includes at least one further implantation process using a further implantation mask. The further implantation mask can be obtained by forming spacers 220 along sidewalls of the openings of the first implantation mask 210. Forming the contact region 32 may include several subsequent implantation processes with different implantation energies. Further, each implantation process, also the implantation processes explained with reference to FIGS. 6A to 6J before, include a thermal treatment for activating the implanted doping atoms.

The implantation energies and the implantation doses in the at least one implantation process and the at least one further implantation process are selected such that the lower diode region of the finished device has a maximum of the doping concentration at the desired vertical position x3 (see, FIG. 4). According to one embodiment, the position and the doping concentration of the maximum are defined in the process which forms the first diode region 31. According to another embodiment, both the process for forming the first diode region 31, and the process form forming the second diode region 32 define the position and the doping concentration of the doping maximum.

In the embodiment shown in FIGS. 7A-7B, the second diode region 32 extends deep (more than 50% of a vertical dimension of the first diode region 31) into the first diode region 31. However, this is only an example. According to another embodiment, the second diode region 32 extends less than 50%, or even less than 25% of the vertical dimension of the first diode region 31 into the first diode region 31.

Further, forming the first diode region 31 and the second diode region 32 with different lateral dimensions, that is, using two different implantation masks for forming these first and second diode regions 31, 32 is optional. According to one embodiment, only one mask, such as the mask 210 shown in FIG. 7A is used for forming both, the first diode region 31 in the drift region 11, and the second diode region 32 connecting the first diode region 31 to the source electrode in the finished device.

Referring to FIG. 5, the channel region $11_1$ may have a region with a higher doping concentration than other sections of the drift region 11. The higher doping concentration of the channel region can be obtained by implanting dopant atoms via the first surface 101 into the semiconductor body 100. An implantation mask may be used in order to implant the dopant atoms only in those regions where the finished device includes the channel region $11_1$. The vertical position of the channel region $11_1$ section with the higher doping concentration and the doping concentration can be adjusted by suitably adjusting the implantation energy and implantation dose in this process. The further higher doped region $11_2$ (see, FIG. 1) can be produced by implanting doping atoms into the semiconductor body 100 via the bottom $110_3$ of the trench after the process steps explained with reference to FIG. 6D above.

Figure 8:
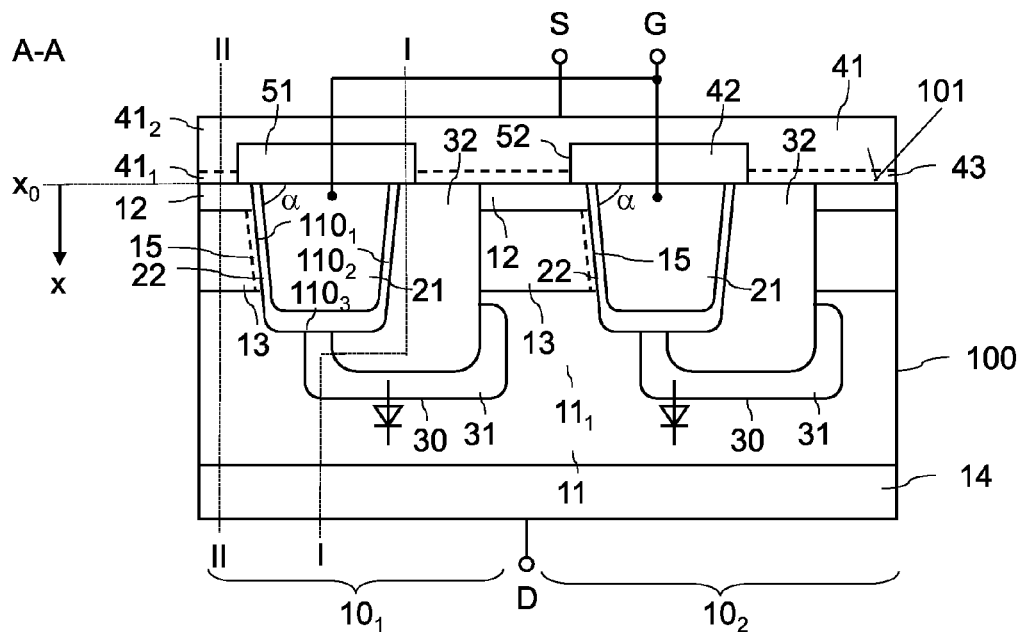
FIG. 8 illustrates a vertical cross sectional view of a semiconductor device according to another embodiment.

FIG. 8 illustrates a vertical cross sectional view of a semiconductor device according to another embodiment. In this embodiment, the gate dielectric 22 is thicker at the trench bottom $110_3$ than at the first sidewall $110_1$. That is, the gate dielectric 22 has a first thickness at the first sidewall $110_1$ and a second thickness at the bottom $110_3$, wherein the second thickness is greater than the first thickness. According to one embodiment, the second thickness is at least 1.5 times the first thickness, at least 2 times the first thickness, or even at least 3 times the first thickness. Due to variations or imperfections in the manufacturing process, the thickness of the gate dielectric 22 may vary along the first sidewall $110_1$ and the bottom $110_3$. Thus, the "thickness" of the gate dielectric 22 at one of the sidewalls $110_1$, $110_2$ or the bottom $110_3$, respectively, is understood as the average thickness or the minimum thickness of the gate dielectric 22 at the respective sidewall/bottom.

Figure 9:
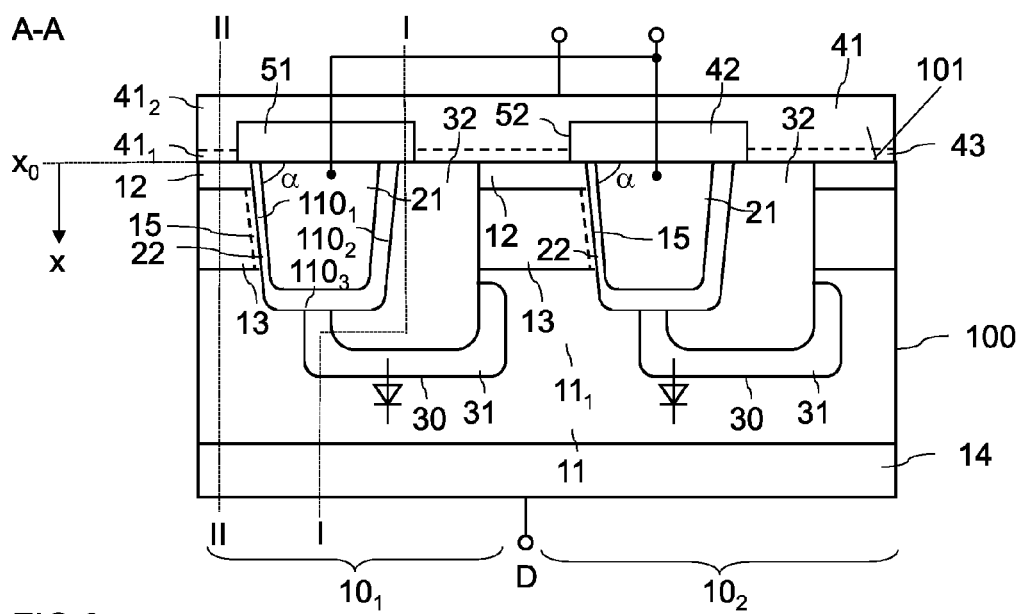
FIG. 9 illustrates a vertical cross sectional view of a semiconductor device according to yet another embodiment.

According to another embodiment shown in FIG. 9, the gate dielectric 22 not only at the bottom $110_3$ of the trench, but also at the second sidewall $110_2$ is thicker than at the first sidewall $110_1$. That is, the gate dielectric 22 has a third thickness at the second sidewall $110_3$ which is greater than the first thickness at the first sidewall $110_1$. According to one embodiment, the third thickness is at least 1.5 times the first thickness, at least 2 times the first thickness, or even at least 3 times the first thickness. The third thickness may substantially be equal the second thickness at the bottom $110_3$, or may be different from the second thickness. According to one embodiment, the first thickness is between 40 nanometers and 100 nanometers. The second thickness and the third thickness, respectively, are, for example, between 60 nanometers and 300 nanometers.

Figure 10A:
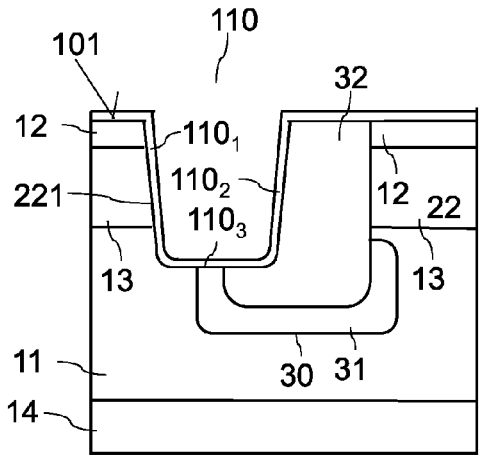
FIGS. 10A to 10D illustrate one embodiment of a method for producing a thicker gate dielectric at a bottom and, optional, one sidewall of a trench.
Figure 10B:
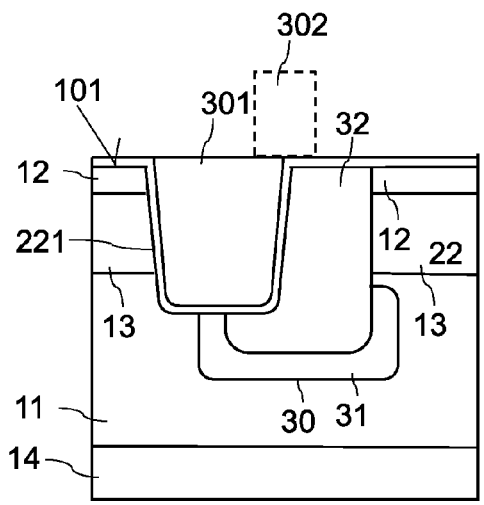
Figure 10C:
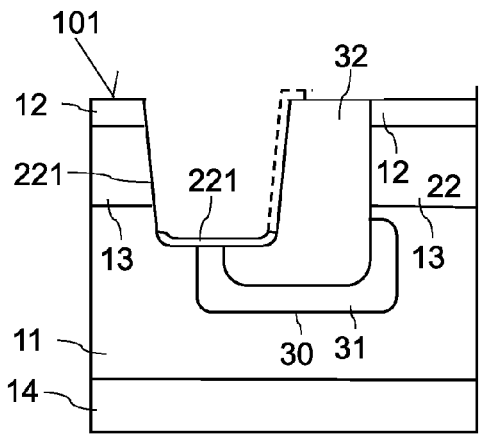

FIGS. 10A-10D illustrate one embodiment of a method for producing a thicker gate dielectric 22 on the bottom $110_3$ and, optionally, the second sidewall $110_2$ of the trench 110. FIGS. 10A-10C show a vertical cross sectional view of the semiconductor body 100 during/after different process sequences of the method. The method explained with reference to FIG. 10A-10C begins after forming the trench 110 in the semiconductor body 100, that is, after the process sequence explained with reference to FIGS. 6A-6D before.

Referring to FIG. 10A, the method includes forming a first dielectric layer 221 on the sidewalls $110_1$, $110_2$ and the bottom $110_3$ of the trench 110. Optionally, this dielectric layer 221 is also formed on the first surface 101. The first dielectric layer 221 may include an oxide. Forming this first dielectric layer 221 may include an oxidation process, a deposition process, or a combination of an oxidation process and a deposition process. For example, the deposition process includes a CVD (Chemical Vapor Deposition) process.

Referring to FIG. 10B, the method further includes filling the trench 110 with a first protection layer 301. For example, the protection layer 301 includes a polycrystalline or amorphous semiconductor material such as, for example, polysilicon or amorphous silicon. Optionally, a second protection layer 302 is formed above the first protection layer 301 and the first surface 101 such that the second protection layer 302 is arranged above that section of the first dielectric layer 221 which covers the second sidewall $110_2$. The second protection layer 302 is optional and can be omitted in those embodiments in which a thicker gate dielectric 22 is only to be produced at the bottom $110_3$. The second protection layer 302 may include a polycrystalline or amorphous semiconductor material, a photoresist, or the like.

The method further includes etching the first dielectric layer 221 selectively against the semiconductor body 100, the first protection layer 301, and the optional second protection layer 302. In this process, the first protection layer 201 protects the first dielectric layer 221 at the bottom $110_3$ from being etched, while the first dielectric layer 221 on the first surface 101 and along the first sidewall $110_1$ can be etched. If the second protection layer 302 is omitted, the first dielectric layer 221 along the second sidewall $110_2$ is also etched, so that, after the etching process, only the first dielectric layer 221 at the bottom $110_3$ remains. In case there is the second protection layer 302 above the second sidewall $110_2$, not only the first dielectric layer 221 at the bottom $110_3$ remains, but also the first dielectric layer 221 along the second sidewall $110_2$ remains.

FIG. 10C shows the semiconductor body 100 after these process steps, and after removing the first protection layer 301 and the optional second protection layer 302. In FIG. 10C, the first dielectric layer 221 along the second sidewall $110_2$ is illustrated in dashed lines, as this part of first dielectric layer 221 is optional and only remains if the second protection layer 302 is produced.

Figure 10D:
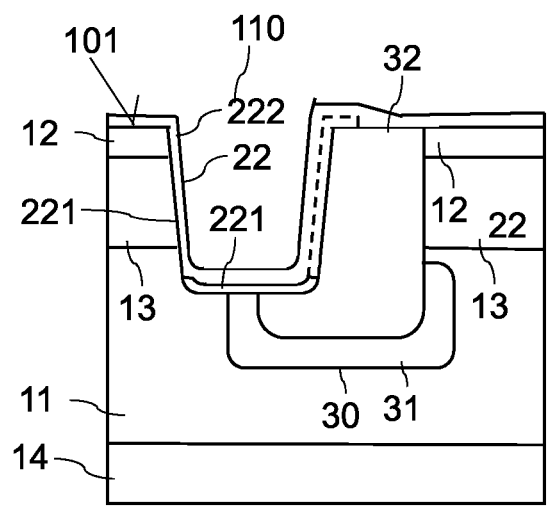

Referring to FIG. 10D, the method further includes forming a second dielectric layer 222 on the sidewalls $110_1$, $110_2$ and the bottom $110_3$ of the trench 110. In the trench 110, this second dielectric layer 222 adds to the first dielectric layer 221. The first dielectric layer 221 and the second dielectric layer 222 form the gate dielectric 22. The gate dielectric 22 is thicker at the first sidewall $110_1$ where only the second dielectric layer 222 is produced, is thicker at the bottom $110_3$ where the first dielectric layer 221 and the second dielectric layer 222 are produced, and may be thicker at the second sidewall $110_2$, where the second dielectric layer 222 and, optionally, the first dielectric layer 221 is produced. The further method steps for producing the semiconductor device may correspond to the method steps explained with reference to FIGS. 6F-6J before.

Figure 11A:
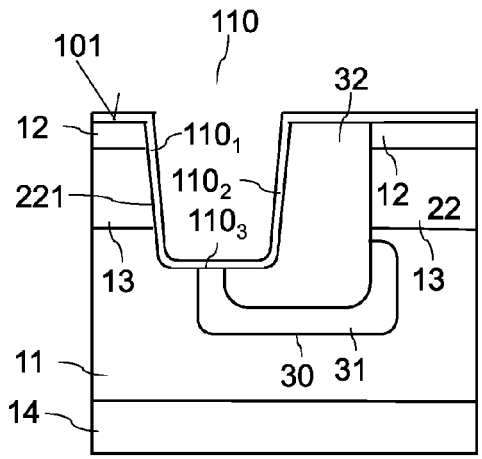
FIGS. 11A to 11D illustrate another embodiment of a method for producing a thicker gate dielectric at a bottom and, optional, one sidewall of a trench.

FIGS. 11A-11D illustrate a method for forming the gate dielectric 22 according to another embodiment. Referring to FIG. 11A the method includes forming a first dielectric layer 221 on the sidewalls $110_1$, $110_2$ and the bottom $110_3$ of the trench 110. The first dielectric layer 221 may be produced as explained with reference to FIG. 10A before.

The method further includes removing the first dielectric layer 221 at least along the first sidewall $110_1$. Optionally, the first dielectric layer 221 is also removed along the second sidewall $110_2$. Removing the first dielectric layer 221 along the first sidewall $110_1$ may include forming a mask layer on the first dielectric layer 221 above the bottom $110_3$ and, optionally, above the second sidewall $110_2$.

Figure 11B:
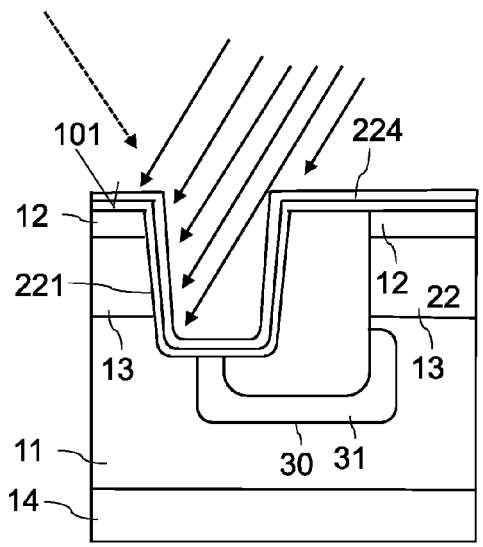

Referring to FIG. 11B, forming this mask layer may include forming a sacrificial layer 224 above the first dielectric layer 221. According to one embodiment, this sacrificial layer 224 includes a polycrystalline semiconductor material such as, for example, polysilicon. Referring to FIG. 11B, this sacrificial layer 224 is subject to a damage implantation in those regions where it is desired to remove the sacrificial layer 224. Referring to FIG. 11B, the sacrificial layer 224 along the first surface 101 and along the first sidewall $110_1$ may be subject to damage implantation. A tilted implantation may be used in order to protect the sacrificial layer 224 at the bottom $110_3$ and at the second sidewall $110_2$ from being implanted. Examples of ions used in the damage implantation process include noble gas ions such as, for example, argon or xenon ions.

Figure 11C:
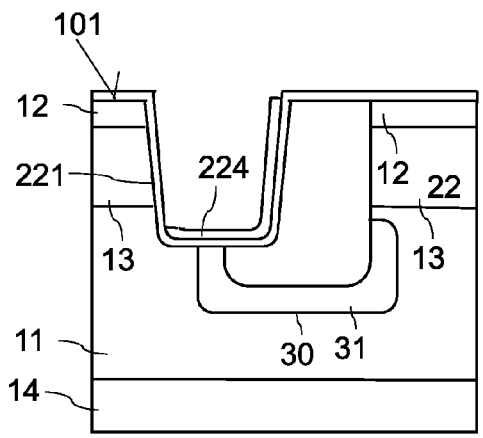

In next process steps, those sections of the sacrificial layer 224 which were damage implanted are removed in an etching process which selectively etches damaged sacrificial layer sections against none-damaged sacrificial layer section. FIG. 11C shows the sacrificial layer 224 after this selective etching process. The remaining sections of the sacrificial layer 224 are than used as an etch mask for etching those sections of the first dielectric layer 221 which are not covered by the sacrificial layer 224. The result of this is illustrated in FIG. 11D.

Figure 11D:
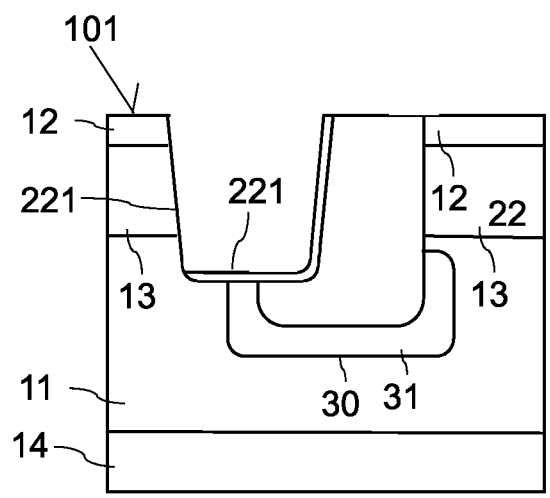

Referring to FIG. 11D, the first dielectric layer 221 remains at the bottom $110_3$ and the second sidewall $110_2$ of the trench 110. This structure corresponds to the structure explained with reference to FIG. 10C. Thus, the further process steps for forming the gate dielectric 22 may correspond to the process steps explained with reference to FIG. 10D before.

Based on the method explained with reference to FIG. 11A-11D a thicker gate dielectric 22 is formed on the bottom $110_3$ and on the second sidewall $110_2$, as the first dielectric layer 221 in this method remains on the bottom $110_3$ and the second sidewall $110_2$. However, this method can easily be modified to form the first dielectric layer 221 only on the bottom $110_3$ of the trench 110. The modified method includes a further damage implantation process which is selected such that the sacrificial layer 224 is damage implanted not only above the first sidewall $110_1$, but also above the second sidewall $110_2$. A tilted implantation employing an implantation angle may be used that is different from the implantation angle in the method shown in FIG. 11B. Let, for example, β (beta) be the implantation angle relative to the first surface 101 in the method shown in FIG. 11B, then then the implantation angle additionally used in the modified method is −β (illustrated in dotted lines in FIG. 11B).

However, the sacrificial layer 224 at the bottom $110_3$ is not damage implanted in the modified method. If the sacrificial layer 224 is damage implanted above the second sidewall $110_2$ the etching process explained with reference to FIG. 11C etches the sacrificial layer 224 also above the second sidewall $110_2$, so that the sacrificial layer 224 remains as a mask layer only above the bottom $110_3$. Consequently, the etching process which etches the first dielectric layer 221 leaves the first dielectric layer 221 only on the bottom $110_3$ of the trench 110.

It is to be understood that the features of the various embodiments described herein may be combined with each other, unless specifically noted otherwise.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising a semiconductor body and at least one device cell integrated in the semiconductor body, the at least one device cell comprising:
 a drift region, a source region, and a body region arranged between the source region and the drift region;
 a diode region and a pn junction between the diode region and the drift region;
 a trench with a first sidewall, a second sidewall opposite the first sidewall, and a bottom, the body region adjoining the first sidewall, the diode region adjoining the second sidewall, and the pn junction adjoining the bottom of the trench;
 a gate electrode arranged in the trench and dielectrically insulated from the body region, the diode region and the drift region by a gate dielectric;
 wherein the diode region comprises a lower diode region arranged below the bottom of the trench; and
 wherein the lower diode region has a maximum of a doping concentration distant to the bottom of the trench.

2. The semiconductor device of claim 1, comprising at least two device cells, wherein the diode regions of the at least two device cells are distant in a lateral direction of the semiconductor body.

3. The semiconductor device of claim 2, wherein the distance between the diode regions of the at least two device cells is between 0.5 micrometers and 2 micrometers, between 0.25 times and 1.5 times a width of the trench, or between 30% and 60% of a lateral width of the diode region in the drift region below the trench.

4. The semiconductor device of claim 1, wherein the distance between the bottom of the trench and the maximum of the doping concentration is between 200 nanometers and 1 micrometer.

5. The semiconductor device of claim 4, wherein the distance between the bottom of the trench and the maximum of the doping concentration is between 250 nanometers and 500 nanometers.

6. The semiconductor device of claim 1, wherein the maximum doping concentration is between 1E18 cm$^{-3}$ and 5E18 cm$^{-3}$.

7. The semiconductor device of claim 1, wherein the diode region further comprises a local minimum of the doping concentration between a position of the maximum doping concentration and the bottom of the trench.

8. The semiconductor device of claim 7, wherein the local minimum doping concentration is between 5E17 cm$^{-3}$ and 1E18 cm$^{-3}$.

9. The semiconductor device of claim 1, wherein the gate dielectric has a first thickness at the first sidewall of the trench and a second thickness at the second sidewall of the trench, wherein the second thickness is greater than the first thickness.

10. The semiconductor device of claim 9, wherein the second thickness is at least 1.5 times the first thickness.

11. The semiconductor device of claim 1, wherein the gate dielectric has a first thickness at the first sidewall of the trench and a third thickness at the bottom of the trench, wherein the third thickness is greater than the first thickness.

12. The semiconductor device of claim 11, wherein the third thickness is at least 1.5 times the first thickness.

13. The semiconductor device of claim 1, wherein the trench has a rounded corner between the first sidewall and the bottom, and wherein a radius of the rounded corner is at least 2 times a thickness of the gate dielectric at the first sidewall.

14. The semiconductor device of claim 2, wherein the drift region has a local maximum of a doping concentration between the diode regions of two neighboring device cells of the at least two device cells.

15. The semiconductor device of claim 1, further comprising:
 a source electrode electrically connected to the source region and the diode region of each device cell.

16. The semiconductor device of claim 1, wherein the diode region further comprises:

a first diode region forming the pn-junction with the drift region; and a second diode region more highly doped than the first diode region and connected to the source electrode.

17. The semiconductor device of claim 16, wherein the second diode region adjoins the second sidewall of the trench.

18. The semiconductor device of claim 2, wherein the at least two device cells are adjacent, and wherein the diode region of one device cell adjoins the body region of another device cell.

19. The semiconductor device of claim 1, wherein the semiconductor body comprises a SiC crystal, and wherein the first sidewall of the trench is aligned with a c-axis of the SiC crystal.

20. The semiconductor device of claim 19, wherein an angle between the first surface of the semiconductor body and the first sidewall of the trench is between 80° and 89°.

21. A method of producing a semiconductor device, the method comprising:

providing a semiconductor body comprising a drift region layer, a body region layer adjoining the drift region layer, and a source region layer adjoining the body region layer and forming a first surface of the semiconductor body;

forming a diode region which extends from the first surface through the source region layer and the body region layer into the drift region layer, the diode region and the drift region layer forming a pn-junction;

forming a trench having a first sidewall, a second sidewall opposite the first sidewall, and a bottom, the trench adjoining the body region layer on the first sidewall, the diode region on the second sidewall and the pn-junction on the bottom; and forming in the trench a gate electrode and a gate dielectric dielectrically insulating the gate electrode from the semiconductor body, wherein sections of the source region layer remaining after forming the diode region form a source region and wherein sections of the body region layer remaining after forming the diode region form a body region, wherein forming the diode region comprises forming a lower diode region below the bottom of the trench, and forming a maximum of a doping concentration of the lower diode region distant to the bottom of the trench.

22. The method of claim 21, further comprising:
forming an insulation layer on the first surface;
forming a first contact opening in the insulation layer above the diode region and the source region; and
forming a source electrode electrically connected to the source region and the diode region in the first contact opening.

23. The method of claim 22, further comprising:
forming a second contact opening in the insulation layer above the gate electrode; and
forming a gate connection electrode electrically connected to the gate electrode in the second contact opening.

24. The method of claim 21, wherein the semiconductor body comprises an SiC crystal, and wherein the trench is formed such that the first sidewall of the trench is aligned with a c-axis of the SiC crystal.

25. The method of claim 24, wherein the first trench is formed such that an angle between the first surface of the semiconductor body and the first sidewall of the trench is between 80° and 89°.

26. The method of claim 21, wherein forming the gate dielectric comprises forming the gate dielectric with a first thickness at the first sidewall of the trench and a second thickness at the second sidewall of the trench, wherein the second thickness is greater than the first thickness.

27. The method of claim 26, wherein the second thickness is at least 1.5 times the first thickness.

28. The method of claim 21, wherein forming the gate dielectric comprises forming the gate dielectric with a first thickness at the first sidewall of the trench and a third thickness at the bottom of the trench, wherein the third thickness is greater than the first thickness.

29. The method of claim 28, wherein the third thickness is at least 1.5 times the first thickness.

30. The method of claim 21, further comprising:
after forming the trench, subjecting the semiconductor body to a thermal treatment in a hydrogen atmosphere.

* * * * *